United States Patent
Trinh et al.

(10) Patent No.: US 12,239,035 B2
(45) Date of Patent: Feb. 25, 2025

(54) RESISTIVE MEMORY CELL HAVING A LOW FORMING VOLTAGE

(71) Applicant: Taiwan Semiconductor Manufacturing Company, Ltd., Hsin-Chu (TW)

(72) Inventors: Hai-Dang Trinh, Hsinchu (TW); Chii-Ming Wu, Taipei (TW); Hsing-Lien Lin, Hsin-Chu (TW); Tzu-Chung Tsai, Hsinchu County (TW); Fa-Shen Jiang, Taoyuan (TW); Bi-Shen Lee, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 188 days.

(21) Appl. No.: 17/867,973

(22) Filed: Jul. 19, 2022

(65) Prior Publication Data
US 2022/0367810 A1    Nov. 17, 2022

Related U.S. Application Data

(62) Division of application No. 16/807,564, filed on Mar. 3, 2020, now Pat. No. 11,527,717.
(Continued)

(51) Int. Cl.
*H10N 70/00*    (2023.01)
*H10B 63/00*    (2023.01)

(52) U.S. Cl.
CPC ......... *H10N 70/8833* (2023.02); *H10B 63/30* (2023.02); *H10N 70/026* (2023.02);
(Continued)

(58) Field of Classification Search
CPC ... H10N 70/041; H10N 70/043; H10N 70/826
See application file for complete search history.

(56) References Cited

U.S. PATENT DOCUMENTS

| | | | |
|---|---|---|---|
| 8,450,715 B2 | 5/2013 | Takano et al. | |
| 9,012,260 B2 | 4/2015 | Barabash et al. | |
| | (Continued) | | |

FOREIGN PATENT DOCUMENTS

| | | |
|---|---|---|
| CN | 109155363 A | 1/2019 |
| TW | 201906136 A | 2/2019 |
| TW | 201931631 A | 8/2019 |

OTHER PUBLICATIONS

Notice of Allowance dated Aug. 10, 2022 for U.S. Appl. No. 16/807,564.
(Continued)

*Primary Examiner* — Mark V Prenty
(74) *Attorney, Agent, or Firm* — Eschweiler & Potashnik, LLC (57) ABSTRACT

Various embodiments of the present disclosure are directed towards a method for forming a memory device. The method includes forming a bottom electrode over a substrate. A data storage structure is formed on the bottom electrode. The data storage structure comprises a first atomic percentage of a first dopant and a second atomic percentage of a second dopant. The first atomic percentage is different from the second atomic percentage. A top electrode is formed on the data storage structure.

20 Claims, 8 Drawing Sheets

Related U.S. Application Data (60) Provisional application No. 62/893,977, filed on Aug. 30, 2019.

(52) U.S. Cl.
CPC ......... *H10N 70/063* (2023.02); *H10N 70/826* (2023.02); *H10N 70/841* (2023.02); *H10N 70/023* (2023.02)

(56) References Cited

U.S. PATENT DOCUMENTS

| | | | |
|---|---|---|---|
| 9,799,705 B1 | 10/2017 | Yi et al. | |
| 10,236,061 B2* | 3/2019 | Hou | H10N 70/8833 |
| 10,355,205 B2 | 7/2019 | Majhi et al. | |
| 11,404,638 B2 | 8/2022 | Lee et al. | |
| 11,527,717 B2* | 12/2022 | Trinh | H10N 70/24 |
| 2008/0164568 A1 | 7/2008 | Lee et al. | |
| 2011/0068316 A1 | 3/2011 | Takano et al. | |
| 2011/0095259 A1 | 4/2011 | Lee | |
| 2014/0151623 A1 | 6/2014 | Jeon et al. | |
| 2014/0166958 A1 | 6/2014 | Barabash et al. | |
| 2014/0175355 A1 | 6/2014 | Wang et al. | |
| 2015/0021540 A1 | 1/2015 | Xie et al. | |
| 2015/0028278 A1 | 1/2015 | Lee et al. | |
| 2015/0236259 A1 | 8/2015 | Ramaswamy | |
| 2015/0349250 A1 | 12/2015 | Chang et al. | |
| 2016/0020390 A1 | 1/2016 | Chang et al. | |
| 2016/0028003 A1 | 1/2016 | Wang | |
| 2018/0269390 A1 | 9/2018 | Saitoh et al. | |
| 2018/0375024 A1 | 12/2018 | Chu et al. | |
| 2019/0036020 A1 | 1/2019 | Majhi et al. | |
| 2019/0115533 A1 | 4/2019 | Borowski et al. | |
| 2019/0165266 A1 | 5/2019 | Trinh et al. | |
| 2019/0214556 A1 | 7/2019 | Chen et al. | |
| 2019/0244661 A1 | 8/2019 | Kim et al. | |
| 2020/0106013 A1 | 4/2020 | Strutt et al. | |
| 2020/0220367 A1 | 7/2020 | Cho et al. | |

OTHER PUBLICATIONS

Kim et al. "Current Conduction Mechanism of Nitrogen-Doped AlOx RRAM." IEEE Transactions on Electron Devices, vol. 61, No. 6, Jun. 2014.

Wong et al. "Metal-Oxide RRAM." Proceedings of the IEEE, vol. 100, No. 6, Jun. 2012.

Yang et al. "Role of nitrogen incorporation into Al2O3-based resistive random-access memory." Applied Physics Express 7, 074202 (2014), published Jun. 17, 2014.

U.S. Appl. No. 16/940,529, filed Jul. 28, 2020.

Scott et al, Thermal conductivity and thermal boundary resistance of atomic layer deposited high-k dielectric aluminum oxide, hafnium oxide, and titanium oxide, APL Mater. 6, 058302 (2018) (Year: 2018).

Sze et al., Physics of Semiconductor Devices, John Wiley & Sons, 2007, pp. 293-298 (Year: 2007).

Non-Final Office Action dated Sep. 17, 2021 for U.S. Appl. No. 16/807,564.

Non-Final Office Action dated Jun. 25, 2021 for U.S. Appl. No. 16/807,564.

Non-Final Office Action dated Sep. 22, 2021 for U.S. Appl. No. 16/807,564.

Non-Final Office Action dated Dec. 27, 2021 for U.S. Appl. No. 16/807,564.

Non-Final Office Action dated Apr. 1, 2022 for U.S. Appl. No. 16/807,564.

* cited by examiner

RESISTIVE MEMORY CELL HAVING A LOW FORMING VOLTAGE

REFERENCE TO RELATED APPLICATIONS

This application is a Divisional of U.S. application Ser. No. 16/807,564, filed on Mar. 3, 2020, which claims the benefit of U.S. Provisional Application No. 62/893,977, filed on Aug. 30, 2019. The contents of the above-referenced patent applications are hereby incorporated by reference in their entirety.

BACKGROUND

Many modern electronic devices contain electronic memory configured to store data. Electronic memory may be volatile memory or non-volatile memory. Volatile memory stores data while it is powered, while non-volatile memory is able to keep data when power is removed. Resistive random access memory (RRAM) is one promising candidate for next generation non-volatile memory technology due to its simple structure and compatibility with complementary metal-oxide semiconductor (CMOS) logic processes. An RRAM cell includes a dielectric data storage structure having a variable resistance, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage structure (e.g., one or more oxide layer(s)) arranged between a top electrode and a bottom electrode. The RRAM cell is disposed over a semiconductor substrate. A variable resistance of the data storage structure represents a data unit, such as a bit of data. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

Before an RRAM cell can be used to store data, an initial conductive path (i.e., conductive filament) is typically formed across the data storage structure. Formation of the initial conductive path makes subsequent write operations (that form the conductive path) easier to perform. To form the initial conductive path, at the end of the RRAM manufacturing process a forming voltage is applied across the top and bottom electrodes. In some types of RRAM cells, the conductive path may include vacancies (e.g., oxygen vacancies). In such devices the forming voltage may knock oxygen atoms out of a lattice of the data storage structure, thereby forming localized oxygen vacancies. These localized oxygen vacancies tend to align to form the conductive path which extends through the data storage structure. Thereafter, set or reset voltages can be applied across the top and bottom electrodes to change resistivity of the data storage structure between the high resistance state and the low resistance state. Generally, the forming voltage is greater than the set voltage. Typically, one or more transistors (e.g., a metal-oxide-semiconductor field-effect transistor (MOSFET)) disposed on/over the semiconductor substrate provide voltages to the RRAM cell, such that the forming voltage, the set voltage, and the reset voltage may be applied across the top electrode and the bottom electrode.

In some embodiments in which the conductive filament is formed before the RRAM cell is used to store data, the data storage structure may be or comprise an undoped metal oxide structure (e.g., undoped aluminum oxide ($AlO_x$)). In such embodiments, the forming voltage may be relatively high. In an effort to improve device density and device performance, feature sizes of the one or more transistors and/or RRAM cell are continually being scaled down. However, as the feature sizes of the one or more transistors are scaled down, the relatively high forming voltage becomes problematic (e.g., due to the reduced feature sizes of the one or more transistors reducing breakdown voltages). The relatively high forming voltage may be greater than a safe output voltage of the one or more transistors. Accordingly, if the one or more transistors are operated to output the relatively high forming voltage, the one or more transistors may be damaged and/or destroyed.

The present application, in some embodiments, is directed toward an RRAM cell that has a low forming voltage. The RRAM cell includes a bottom electrode disposed within an inter-level dielectric (ILD) structure that is disposed over a substrate. A top electrode is disposed within the ILD structure and overlies the bottom electrode. A data storage structure is disposed within the ILD structure and between the top and bottom electrodes. The data storage structure comprises a dielectric material (e.g., aluminum oxide ($AlO_x$)) co-doped with a first dopant (e.g., nitrogen) and a second dopant (e.g., tantalum). Because the data storage structure is co-doped with the first and second dopants, a forming voltage of the RRAM cell may be improved (e.g., reduced) while maintaining good reliability of the RRAM cell. For example, doping the data storage structure with the first dopant may reduce or eliminate the forming voltage of the RRAM cell and doping the data storage structure with the second dopant may ensure good reliability of the RRAM cell is maintained (e.g., good retention performance). Accordingly, an integrated chip comprising the RRAM cell may have one or more transistor(s) with scaled down feature sizes that can safely provide the low forming voltage to the RRAM cell. This in turn facilitates shrinking the feature sizes of the RRAM cell and the one or more transistor(s) while mitigating and/or eliminating damage to the RRAM cell and/or the one or more transistors(s).

Figure 1:
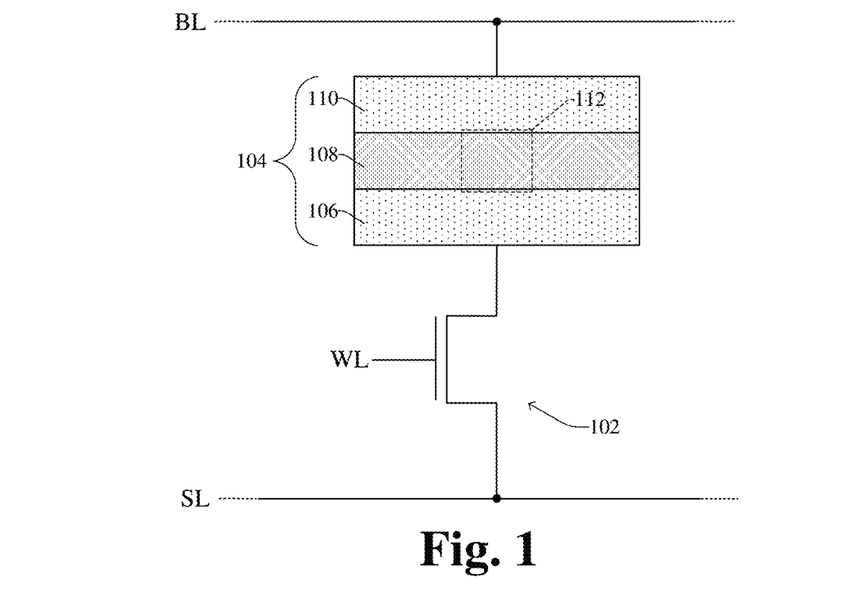
FIG. 1 illustrates a schematic view of some embodiments of a memory device including a memory cell having a low forming voltage.

FIG. 1 illustrates a schematic view of some embodiments of a memory device 100 including a memory cell 104 having a low forming voltage.

In some embodiments, the memory device 100 includes the memory cell 104 electrically coupled to a transistor 102, such that the memory device 100 is in a one transistor-one resistive memory cell (1T1R) configuration. In further embodiments, the transistor 102 may for example be a metal-oxide-semiconductor field-effect transistor (MOSFET). The memory cell 104 includes a bottom electrode 106, a top electrode 110, and a data storage structure 108 disposed between the bottom and top electrodes 106, 110. A bit line (BL) is electrically coupled to one end of the data storage structure 108 through the top electrode 110, and a source line (SL) is electrically coupled to an opposite end of the data storage structure 108 through the transistor 102. A word line (WL) is electrically coupled to a gate electrode of the transistor 102. Thus, application of a suitable WL voltage to the gate electrode of the transistor 102 couples the memory cell 104 between the BL and the SL. Consequently, in some embodiments, by providing suitable bias conditions, the memory cell 104 can be switched between two states of electrical resistance, a low resistance state and a high resistance state, to store data.

In some embodiments, the data storage structure 108 comprises a dielectric material (e.g., aluminum oxide ($AlO_x$)) co-doped with a first dopant (e.g., nitrogen) and a second dopant (e.g., tantalum). Thus, in various embodiments, the data storage structure 108 may comprise aluminum oxide, nitrogen, and tantalum and/or may have a thickness within a range of about 20 to 80 angstroms. In further embodiments, between about 1 to 15 percent of a chemical composition of the data storage structure 108 is the first dopant (e.g., nitrogen). In yet further embodiments, between about 2 to 20 percent of the chemical composition of the data storage structure 108 is the second dopant (e.g., tantalum). In some embodiments, the memory cell 104 may be configured as a resistive random access memory (RRAM) cell, such that the data storage structure 108 comprises material(s) having a variable resistance configured to undergo a reversible phase change between a high resistance state and a low resistance state.

In some embodiments, before the memory cell 104 may be used to store data, an initial conductive path (i.e., conductive filament) is typically formed with a region 112 across the data storage structure 108. Formation of the initial conductive path makes subsequent write operations (that form the conductive path) easier to perform. In further embodiments, to form the initial conductive path, a forming voltage is applied across the top electrode 110 and the bottom electrode 106 by the transistor 102 and the BL. The initial conductive path may include vacancies (e.g., oxygen vacancies). In such embodiments, the forming voltage may knock oxygen atoms out of a lattice of the data storage structure 108, thereby forming localized oxygen vacancies. These localized vacancies tend to align within the region 112 to form the initial conductive path which extends within the data storage structure 108 from the bottom electrode 106 to the top electrode 110. Thereafter, set or reset voltages can be applied across the bottom and top electrodes 106, 110, by way of the transistor 102 and the BL, to change resistivity of the data storage structure 108 between the high resistance state and the low resistance state.

In various embodiments, by virtue of the data storage structure 108 comprising the first dopant (e.g., nitrogen), the forming voltage may be reduced and/or eliminated. For example, in some embodiments, formation of the initial conductive path may not be performed before a set operation is performed on the memory cell 104, such that a forming voltage is not applied across the data storage structure 108 and/or the transistor 102. This in turn facilitates shrinking the feature sizes of the memory cell 104 and/or the transistor 102 while mitigating and/or eliminating damage to the memory cell 104 and/or the transistor 102. In some embodiments, the forming voltage may be equal to a set voltage. In yet further embodiments, the forming voltage may be about equal to the set voltage and/or the forming voltage may be within a range of about 0 to 25 percent greater than the set voltage. In some embodiments, if the set voltage is about 2 volts (V), then the forming voltage is less than about 2.5 V. In some embodiments, the first dopant may, for example, decrease energy required to form vacancies within the data storage structure 108, thereby increasing an ability to form localized oxygen vacancies within the region 112. In further embodiments, by virtue of the data storage structure 108 comprising the second dopant (e.g., tantalum), data retention of the memory cell 104 may be improved. In such embodiments, the second dopant has a strong bond with oxygen atoms within the data storage structure 108, such that the strong bond may not be broken by a baking process performed on the memory cell 104. In some embodiments, the strong bond between the second dopant and the oxygen atoms may be greater than about 600 kilojoules per mole (kJ/mol). For example, if the second dopant is tantalum, then the strong bond between tantalum and oxygen may be within a range of about 805 to 839 kJ/mol. In further embodiments, the strong bond between the second dopant and oxygen is greater than a bond between the first dopant and oxygen, and the bond between the first dopant and oxygen is greater than a bond between aluminum and oxygen. In yet further embodiments, the bond between the first dopant and oxygen may be about 630 kJ/mol and/or the bond between aluminum and oxygen may be within a range of about 490 to 515 kJ/mol. In some embodiments, the baking process may be performed on the memory cell 104 to determine if the data storage structure 108 may retain its data state and/or the baking process may reach a temperature within a range of about 125 to 250 degrees Celsius. Thus, because the data storage structure 108 is co-doped with the first and second dopants, the forming voltage of the memory cell 104 may be improved (e.g., reduced or eliminated) while maintaining good data retention of the memory cell 104.

Figure 2:
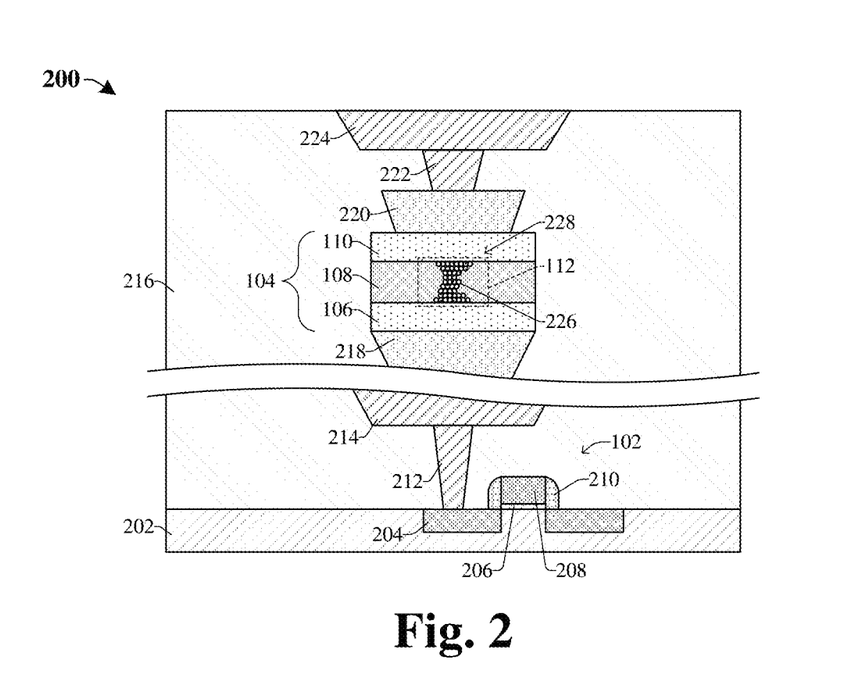
FIG. 2 illustrates a cross-sectional view of some embodiments of a memory device including a memory cell having a co-doped data storage structure.

FIG. 2 illustrates a cross-sectional view of some embodiments of a memory device 200 including the memory cell 104 having the data storage structure 108 that comprises the first dopant and the second dopant.

The memory device 200 includes an interconnect dielectric structure 216 and a substrate 202. In some embodiments, the substrate 202 may for example, be or comprise a semiconductor body such as monocrystalline silicon/CMOS bulk, silicon-germanium (SiGe), a silicon-on-insulator (SOI), or another suitable semiconductor substrate material and/or the substrate 202 may comprise a first doping type (e.g., p-type). The transistor 102 be disposed over/within the substrate 202. In some embodiments, the transistor 102 may, for example, be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, or another suitable transistor. In further embodiments, the transistor 102 may include source/drain regions 204, a gate dielectric layer 206, a gate electrode 208, and/or a sidewall spacer structure 210. The source/drain regions 204 may be disposed within the substrate 202 and/or may comprise a second doping type (e.g., n-type) opposite the first doping type.

A lower interconnect via 212 is disposed within the interconnect dielectric structure 216 and overlies a source/drain region 204 of the transistor 102. In some embodiments, the interconnect dielectric structure 216 may, for example, be or comprise one or more inter-level dielectric (ILD) layers. The one or more ILD layers may, for example, respectively be or comprise silicon oxide, a low κ dielectric material, an extreme low κ dielectric material, another suitable dielectric material, or a combination of the foregoing. As used herein, a low κ dielectric material may be or comprise, for example, a dielectric material with a dielectric constant κ less than approximately 3.9, 3, 2, or 1. A lower interconnect wire 214 overlies the lower interconnect via 212. In some embodiments, the lower interconnect via and wire 212, 214 may, for example, each be or comprise copper, aluminum, tungsten, another suitable conductive material, or a combination of the foregoing. A bottom electrode via 218 is disposed within the interconnect dielectric structure 216 and overlies the lower interconnect wire 214. A top electrode via 220 overlies the bottom electrode via 218. The memory cell 104 is disposed within the interconnect dielectric structure 216 between the bottom electrode via 218 and the top electrode via 220. An upper interconnect via 222 is disposed within the interconnect dielectric structure 216 and overlies the top electrode via 220. An upper interconnect wire 224 overlies the upper interconnect via 222.

In some embodiments, the memory cell 104 includes the bottom electrode 106, the top electrode 110, and the data storage structure 108 disposed between the bottom and top electrodes 106, 110. During operation, the memory cell 104 relies on redox reactions to form and dissolve a conductive path 228 in a region 112 of the data storage structure 108 between the bottom and top electrodes 106, 110. The existence of the conductive path 228 in the region 112 between the bottom and top electrodes 106, 110 produces a low resistance state, while the absence of the conductive path 228 in the region 112 results in a high resistance state. Thus, the memory cell 104 can be switched between the high resistance state and the low resistance state by applying appropriate biases to the memory cell 104 to produce or dissolve the conductive path 228 in the region 112. In further embodiments, the conductive path 228 may, for example, include oxygen vacancies 226 disposed within the region 112 and extending between the bottom and top electrodes 106, 110.

In some embodiments, the data storage structure 108 may comprise a co-doped dielectric material, such that the data storage structure 108 includes a dielectric material, a first dopant, and a second dopant. In some embodiments, the first dopant may be a cation and the second dopant may be an anion. In some embodiments, the dielectric material may, for example, be or comprise a high κ dielectric material, aluminum oxide (e.g., $Al_2O_3$), tantalum oxide, hafnium oxide, another suitable dielectric material, or a combination of the foregoing. As used herein, a high κ dielectric material may, for example, be or comprise a dielectric material with a dielectric constant κ greater than approximately 3.9, 9.34, 9.9, or 11.54. In some embodiments, the first dopant may, for example, be or comprise nitrogen, carbon, fluorine, or the like. In further embodiments, the second dopant may, for example, be or comprise tantalum, cerium, hafnium, zirconium, or the like. Thus, in some embodiments, the data storage structure 108 may, for example, be or comprise aluminum oxide doped with the first and second dopants, where the first dopant is different than the second dopant. In further embodiments, the first dopant may be configured to reduce a forming voltage of the data storage structure 108 and the second dopant may be configured to increase data retention of the data storage structure 108.

In various embodiments, between about 1 to 15 percent of a chemical composition of the data storage structure 108 is the first dopant (e.g., nitrogen, carbon, fluorine, etc.). In some embodiments, if the first dopant is less than 1 percent of the chemical composition of the data storage structure 108, then the forming voltage of the memory cell 104 may not be reduced. In further embodiments, if the first dopant is greater than 15 percent of the chemical composition of the data storage structure 108, then an endurance of the memory cell 104 may be reduced, thereby decreasing a number of set and/or reset operations that may be performed on the data storage structure 108. In some embodiments, between about 2 to 20 percent of the chemical composition of the data storage structure 108 is the second dopant (e.g., tantalum, cerium, hafnium, zirconium, etc.). In some embodiments, if the second dopant is less than about 2 percent of the chemical composition of the data storage structure 108, then data retention of the memory cell 104 may not be increased. In further embodiments, if the second dopant is greater than about 20 percent of the chemical composition of the data storage structure 108, then a number of set and/or reset operations that may be performed on the data storage structure 108 is reduced. In some embodiments, the data storage structure 108 comprises a first atomic percentage of the first dopant and a second atomic percentage of the second dopant. In some embodiments, the first atomic percentage is less than the second atomic percentage. In further embodiments, the first atomic percentage may be within a range of about 1 to 15 percent and/or the second atomic percentage may be within a range of about 2 to 20 percent. In some embodiments, a thickness of the data storage structure 108 is within a range of about 20 to 80 Angstroms. In further embodiments, if the thickness of the data storage structure 108 is less than about 20 Angstroms, then high current leakage may occur between the bottom and top electrodes 106, 110. In yet further embodiments, if the thickness of the data storage structure 108 is greater than about 80 Angstroms, then the forming voltage of the memory cell 104 may be increased.

In some embodiments, the bottom and/or top electrode vias 218, 220 may, for example, respectively be or comprise copper, aluminum, tungsten, a combination of the foregoing, or the like. In some embodiments, the bottom electrode 106 may, for example, be or comprise tantalum, tantalum nitride, titanium nitride, tungsten, ruthenium, iridium, platinum, or the like. In further embodiments, the top electrode 110 may, for example, be or comprise hafnium, hafnium nitride, titanium, titanium nitride, tantalum, tantalum nitride, or the like. In yet further embodiments, between about 20 to 50 percent of the chemical composition of the data storage structure 108 is aluminum and/or between about 50 to 70 percent of the chemical composition of the data storage structure 108 is oxygen. In some embodiments, the bottom electrode 106 may comprise the first dopant (e.g., nitrogen) and/or the top electrode 110 may comprise the first dopant (e.g., nitrogen. In yet further embodiments, the bottom and top electrodes 106, 110 may comprise a same material. In further embodiments, the top electrode 110 may comprise the first dopant (e.g., nitrogen) and/or the second dopant (e.g., tantalum), for example the top electrode 110 may comprise tantalum nitride.

Figure 3:
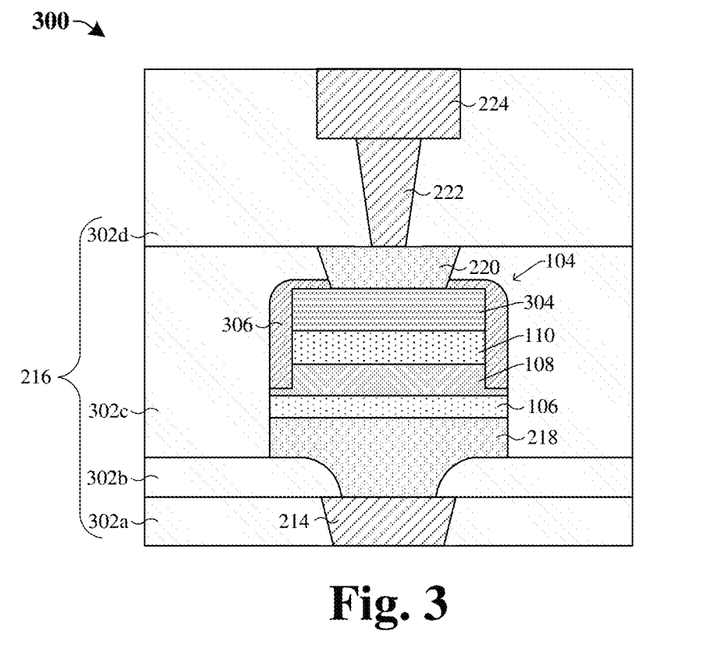
FIGS. 3 and 4 illustrate cross-sectional views of some alternative embodiments of the memory device of FIG. 1.

FIG. 3 illustrates a cross-sectional view of some embodiments of a memory device 300 corresponding to some alternative embodiments of the memory device 200 of FIG. 2.

The interconnect dielectric structure 216 may be or comprise a plurality of ILD layers 302a-d. In some embodiments, the ILD layers 302a-d may, for example, respectively be or comprise an oxide, such as silicon dioxide, a low κ dielectric material, an extreme low κ dielectric material, or anther suitable dielectric material. In some embodiments, the memory cell 104 includes the bottom electrode, 106, the data storage structure 108, the top electrode 110, and a capping layer 304. The capping layer 304 is disposed between the top electrode 110 and the top electrode via 220. In some embodiments, the capping layer 304 may, for example, be or comprise hafnium, titanium, tantalum, aluminum, zirconium, another suitable material, or a combination of the foregoing. In some embodiments, a sidewall spacer structure 306 is disposed around sidewalls of the data storage structure 108, sidewalls of the top electrode 110, and sidewalls of the capping layer 304. In some embodiments, the sidewall spacer structure 306 may, for example, be or comprise silicon carbide, silicon nitride, or the like.

In some embodiments, the data storage structure 108 may comprise a co-doped dielectric material, such that the data storage structure 108 includes a dielectric material (e.g., aluminum oxide ($Al_2O_3$)), a first dopant (e.g., nitrogen, carbon, fluorine, etc.), and a second dopant (e.g., tantalum, cerium, hafnium, zirconium, etc.). In further embodiments, the capping layer 304 comprises the second dopant (e.g., tantalum). In yet further embodiments, the sidewall spacer structure 306 comprises the first dopant (e.g., nitrogen), for example, the sidewall spacer structure 306 may comprise silicon nitride.

Figure 4:
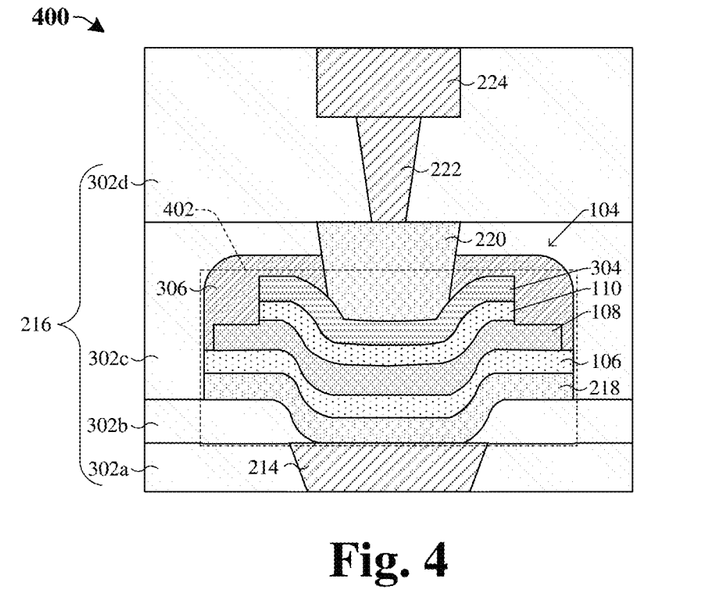

FIG. 4 illustrates a cross-sectional view of some embodiments of a memory device 400 corresponding to some alternative embodiments of the memory device 200 of FIG. 2.

In some embodiments, the memory cell 104 contains a film stack 402 comprising: the bottom electrode via 218, the bottom electrode 106, the data storage structure 108, the top electrode 110, and the capping layer 304. The film stack 402 comprises a middle region over the lower interconnect wire 214 and a peripheral region beneath a pair of sidewalls of the sidewall spacer structure 306. A bottom surface of the middle region of the film stack 402 is disposed below a bottom surface of the peripheral region of the film stack 402.

Figure 5:
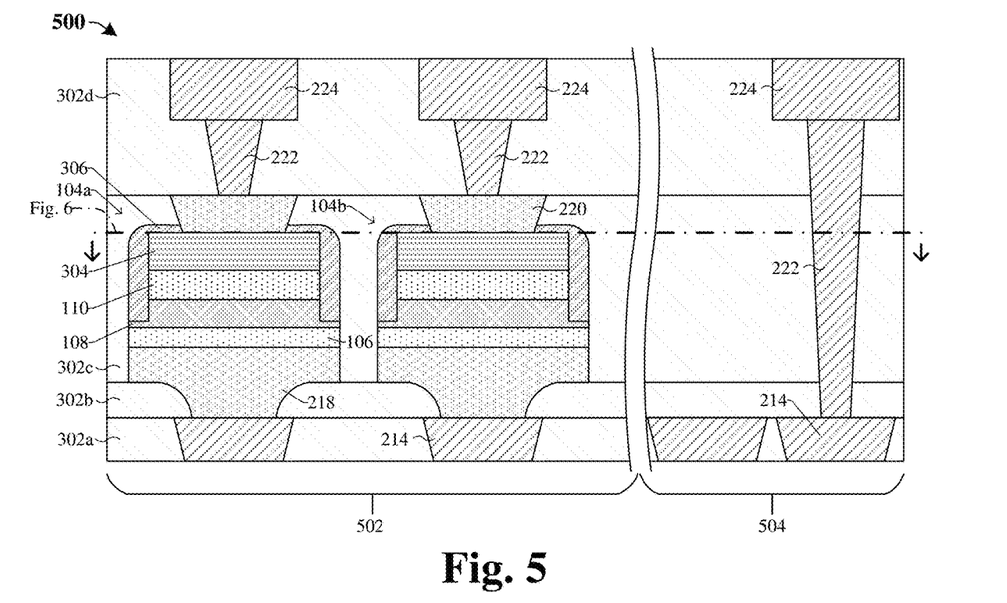
FIG. 5 illustrates a cross-sectional view of some embodiments of an integrated chip including memory cells that each have a low forming voltage disposed within an embedded memory region that is laterally adjacent to a logic region.

FIG. 5 illustrates a cross-sectional view of some embodiments of an integrated chip 500 including a first memory cell 104a and a second memory cell 104b laterally disposed within an embedded memory region 502, in which the embedded memory region 502 is laterally adjacent to a logic region 504.

In some embodiments, the first and/or second memory cells 104a-b are respectively configured as the memory cell 104 of FIG. 3. The first and second memory cells 104a-b are laterally offset from the logic region 504. In some embodiments, the logic region 504 comprises lower interconnect wires 214 disposed within a lower ILD layer 302a. Further, an upper interconnect via 222 is disposed within the logic region 504 and vertically extends from an upper interconnect wire 224 to a lower interconnect wire 214.

Figure 6:
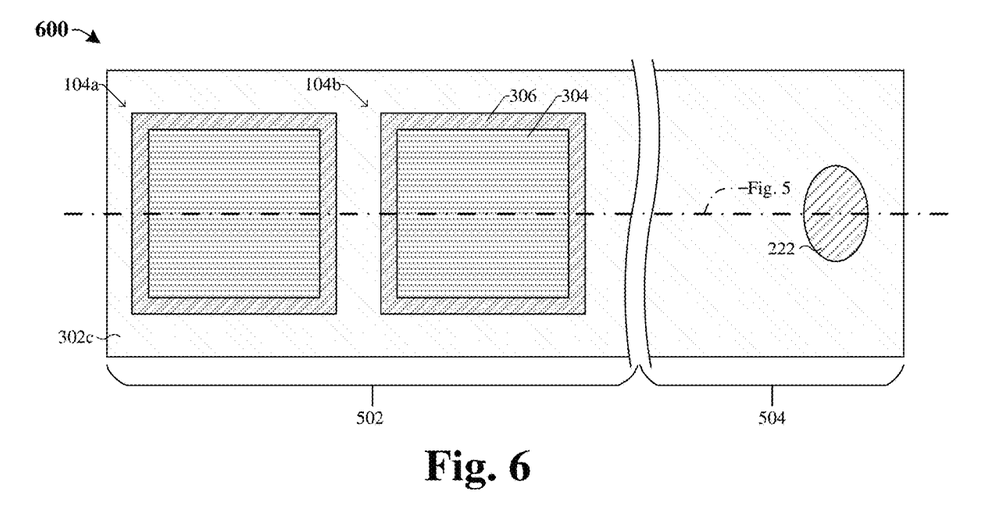
FIG. 6 illustrates a top view of some alternative embodiments of the integrated chip of FIG. 5 according to the line in FIG. 5.

FIG. 6 illustrates a top view 600 of some embodiments of the integrated chip 500 of FIG. 5 taken along the line in FIG. 5.

In some embodiments, as illustrated in FIG. 6, when viewed from above the first and/or second memory cells 104a-b each have a square shape. In some embodiments, when viewed from above the first and/or second memory cells 104a-b may each have a rectangular shape, a circular shape, an elliptical shape, or another suitable shape. Further, the sidewall spacer structure 306 laterally encloses the capping layer 304. In further embodiments, the upper interconnect via 222 within the logic region 504 may, for example, have an elliptical or circular shape when viewed from above.

Figure 7:
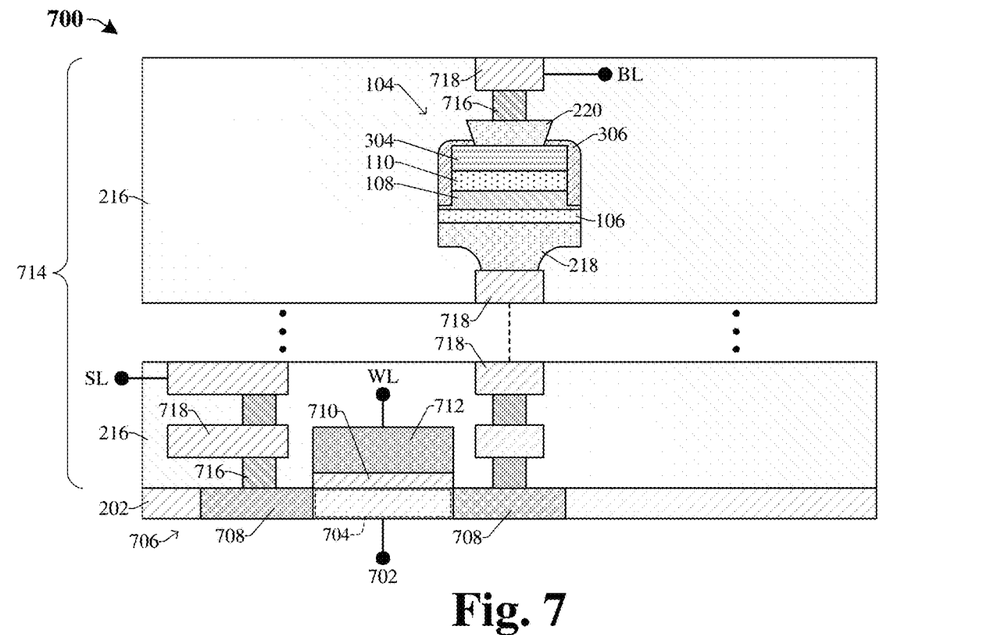
FIGS. 7 and 8 illustrate cross-sectional views of some embodiments of an integrated chip including a memory cell with a low forming voltage disposed within an interconnect structure.

FIG. 7 illustrates a cross-sectional view of some embodiments of an integrated chip 700 including a memory cell 104 disposed within an interconnect structure 714 configured for a one transistor-one resistive memory cell (1T1R) setup.

In some embodiments, the integrated chip 700 includes the interconnect structure 714 overlying a substrate 202. In some embodiments, the substrate 202 may, for example, be or comprise a bulk substrate (e.g., a bulk silicon substrate) or a silicon-on-insulator (SOI) substrate. A transistor 706 is disposed within/over the substrate 202. In some embodiments, the transistor 706 may, for example, be configured as a MOSFET. The transistor 706 includes a pair of source/drain regions 708 disposed within the substrate 202 and laterally spaced apart. A gate dielectric 710 overlies the substrate 202 between the source/drain regions 708, and a gate electrode 712 overlies the gate dielectric 710. In some embodiments, the gate electrode 712 may, for example, be or comprise polysilicon or another suitable conductive material. The substrate 202 comprises a first doping type (e.g., p-type) and the source/drain regions 708 comprise a second doping type (e.g., n-type) opposite the first doping type. In some embodiments, the source/drain regions 708 comprise a doping concentration greater than a doping concentration of the substrate 202. A well region 704 is disposed between the source/drain regions 708 and comprises the first doping type (e.g., p-type) with a high doping concentration than the substrate 202.

The interconnect structure 714 comprises the interconnect dielectric structure 216, a plurality of conductive vias 716, and a plurality of conductive wires 718. The plurality of conductive vias and wires 716, 718 are disposed within the interconnect dielectric structure 216 and are configured to provide electrical connections between various devices (e.g., the transistor 706 and/or the memory cell 104) disposed throughout the integrated chip 700. In some embodiments, the conductive vias and/or wires 716, 718 may, for example, respectively be or comprise copper, aluminum, tungsten, a combination of the foregoing, or some other suitable conductive material. In some embodiments, the memory cell 104 is configured as the memory cell 104 of FIG. 3 and may be disposed between lower and upper layers of the conductive wires 718. In some embodiments, the bottom electrode 106 of the memory cell 104 is electrically coupled to a first source/drain region 708 of the transistor 706 by way of the interconnect structure 714. In further embodiments, the top electrode 110 of the memory cell 104 is electrically coupled to a bit line (BL) by way of the interconnect structure 714.

In some embodiments, the gate electrode 712 of the transistor 706 is electrically coupled to a word line (WL), such that an appropriate WL signal (e.g., a voltage and/or a current) can be applied to the gate electrode 712 to electrically couple the memory cell 104 to the BL and a source line (SL). The SL is electrically coupled to a second source/drain region 708 of the transistor 706 and the BL is electrically coupled to the first source/drain region 708 by way of the interconnect structure 714 and the memory cell 104. Thus, in some embodiments, an output of the BL and/or the memory cell 104 may be accessed at the SL upon application of the appropriate WL signal. In further embodiments, appropriate bias conditions may be applied to the transistor 706 and the memory cell 104 by way of the WL, SL, and BL such that a forming operation, a set operation, a reset operation, or a read operation may be performed on the memory cell 104. In yet further embodiments, a voltage may be applied at a transistor body node 702 that is electrically coupled to the well region 704 (i.e., a body of the transistor 706) disposed beneath the gate electrode 712. The voltage applied at the transistor body node 702 may be configured to assist in controlling a conductive channel formed within the well region 704. In further embodiments, by virtue of the memory cell 104 having a data storage structure 108 comprising the first dopant and the second dopant, feature sizes of the transistor 706 may be reduced.

Figure 8:
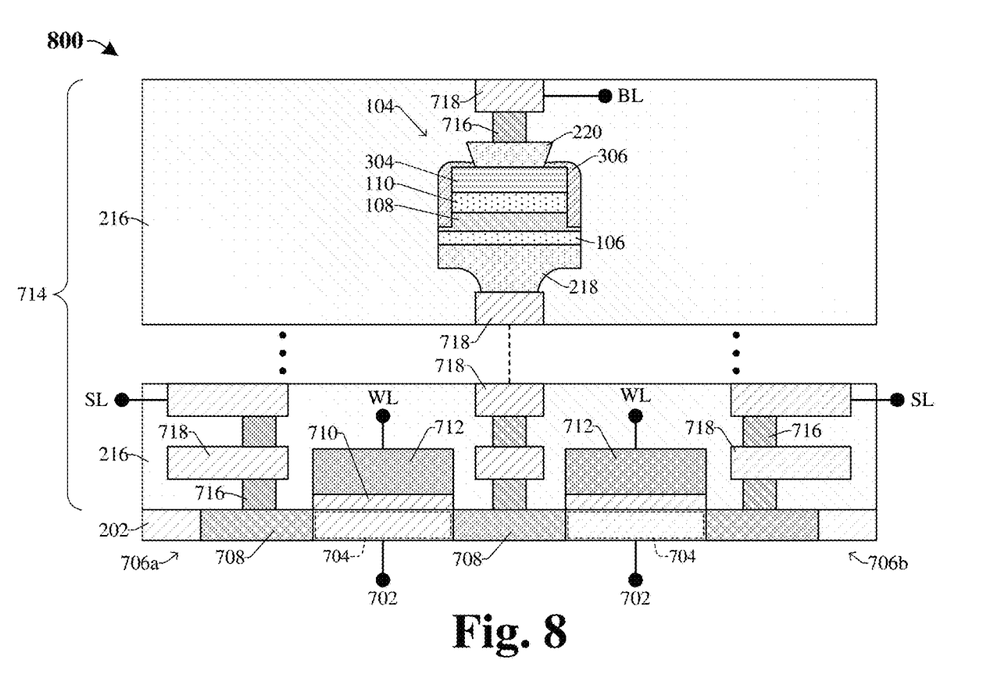

FIG. 8 illustrates a cross-sectional view of some embodiments of an integrated chip 800 corresponding to some alternative embodiments of the integrated chip 700 of FIG. 7. In some embodiments, the integrated chip 800 includes the memory cell 104 disposed within an interconnect structure 714 configured for a two transistor-one resistive memory cell (2T1R) setup.

In some embodiments, the integrated chip 800 includes a first transistor 706a and a second transistor 706b, in which the first and second transistors 706a-b are respectively configured as the transistor 706 of FIG. 7. The first and second transistors 706a-b share a common source/drain region 708 disposed laterally between the first and second transistors 706a-b. The common source/drain region 708 may be electrically coupled to the bottom electrode 106 of the memory cell 104 by way of the interconnect structure 714. In some embodiments, by virtue of the memory cell 104 having a data storage structure 108 comprising the first dopant and the second dopant, feature sizes of the first and second transistors 706a-b may be reduced.

FIGS. 9-14 illustrate cross-sectional views 900-1400 of some embodiments of a method for forming a memory device including a memory cell having a data storage structure that comprises a first dopant and a second dopant according to the present disclosure. Although the cross-sectional views 900-1400 shown in FIGS. 9-14 are described with reference to a method, it will be appreciated that the structures shown in FIGS. 9-14 are not limited to the method but rather may stand along separate of the method. Although FIGS. 9-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 9:
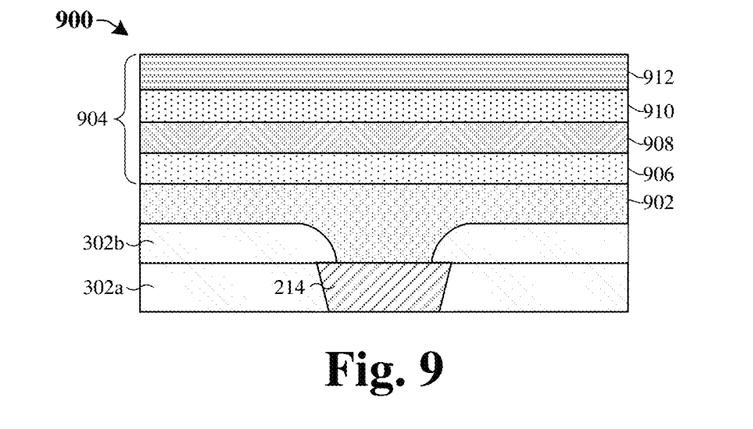
FIGS. 9-14 illustrate cross-sectional views of some embodiments of a method of forming a memory cell with a low forming voltage.

As shown in cross-sectional view 900 of FIG. 9, a lower interconnect wire 214 is formed within a lower ILD layer 302a. A lower dielectric layer 302b is formed over the lower ILD layer 302a. A bottom electrode via layer 902 is formed over the lower interconnect wire 214 and the lower dielectric layer 302b. A memory cell layer stack 904 is formed over the bottom electrode via layer 902. The memory cell layer stack 904 includes: a bottom electrode layer 906, a data storage layer 908, a top electrode layer 910, and a capping film 912. In some embodiments, the layers of the memory cell layer stack 904 may respectively be formed by, for example, chemical vapor deposition (CVD), physical vapor deposition (PVD), atomic layer deposition (ALD), sputtering, co-sputtering, electroless plating, electroplating, or another suitable growth or deposition process.

In some embodiments, formation of the memory cell layer stack 904 may include performing a deposition process for each layer within the memory cell layer stack 904. For example, a first deposition process (e.g., CVD, PVD, etc.) may be performed to form the bottom electrode layer 906 over the bottom electrode via layer 902. Further, a second deposition process (e.g., CVD, PVD, sputtering, co-sputtering, etc.) may be performed to form the data storage layer 908 over the bottom electrode layer 906. In some embodiments, the data storage layer 908 is formed in such a manner that the data storage layer 908 comprises a dielectric material (e.g., aluminum oxide ($Al_2O_3$)) co-doped with a first dopant (e.g., nitrogen) and a second dopant (e.g., tantalum). In some embodiments, the dielectric material may, for example, be or comprise a high κ dielectric material, aluminum oxide (e.g., $Al_2O_3$), tantalum oxide, hafnium oxide, another suitable dielectric material, or a combination of the foregoing. In further embodiments, the first dopant may, for example, be or comprise nitrogen, carbon, fluorine, or the like. In yet further embodiments, the second dopant may, for example, be or comprise tantalum, cerium, hafnium, zirconium, or the like. Further, the data storage layer 908 may be formed, for example, such that the data storage layer 908 comprises a first atomic percentage of the first dopant and a second atomic percentage of the second dopant. In some embodiments, the first atomic percentage may be within a range of about 1 to 15 percent and/or the second atomic percentage may be within a range of about 2 to 20 percent. Furthermore, a process for forming the data storage layer 908 may include depositing a compound (e.g., a compound of the dielectric material (e.g., aluminum oxide ($Al_2O_3$) and the second dopant (e.g., tantalum)) by a deposition process (e.g., CVD, PVD, sputtering, co-sputtering, etc.) while concurrently exposing the compound to an enhancement species (e.g., nitrogen (N)) such that the data storage layer 908 comprises a co-doped dielectric material (e.g., aluminum oxide co-doped with the first and second dopants). In yet further embodiments, an annealing process may be performed on the data storage layer 908 during the deposition process to facilitate the data storage layer 908 comprising the first and/or second dopants. In some embodiments, the enhancement species is a gaseous form of the first dopant. In yet further embodiments, the data storage layer 908 is formed to a thickness within a range of about 20 to 80 Angstroms.

In some embodiments, a process for forming the data storage layer 908 may include performing a co-sputtering process to deposit a compound comprising aluminum oxide and the second dopant (e.g., co-sputtering aluminum oxide (e.g., $Al_2O_3$) and tantalum oxide (e.g., $Ta_2O_5$)) in a plasma environment, where the plasma comprises, for example, nitrogen (e.g., $N_2$). In further embodiments, a process for forming the data storage layer 908 may include performing a CVD process or an ALD process to deposit a compound (e.g., the compound comprises aluminum oxide (e.g., $Al_2O_3$) and tantalum oxide (e.g., $Ta_2O_5$)) in a plasma environment, where the plasma comprises $N_2$ or $NH_3$. In yet further embodiments, a process for forming the data storage layer 908 may include performing a CVD process or an ALD process to form a material (e.g., aluminum oxide) in a chamber using a first precursor and/or a second precursor, in which the first precursor ensures the material is doped with the first dopant and the second precursor ensure the material is doped with the second dopant. In some embodiments, the first precursor may, for example, be or comprise $(NH_4)OH$, or another suitable precursor. In further embodiments, the second precursor may, for example, be or comprise $TaCl_5$, $Ta(OC_2H_5)_5$, or another suitable precursor.

Figure 10:
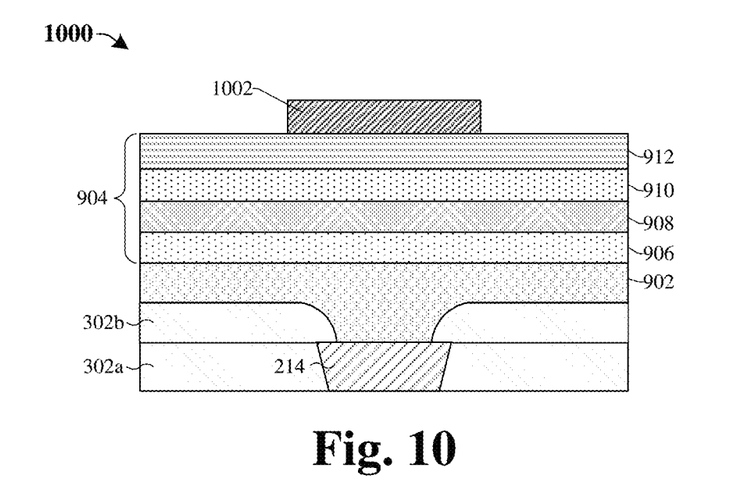

As shown in cross-sectional view 1000 of FIG. 10, a first masking layer 1002 is formed over the memory cell layer stack 904. In some embodiments, the first masking layer 1002 covers a middle region of the memory cell layer stack 904 and leaves a peripheral region of the memory cell layer stack 904 exposed.

Figure 11:
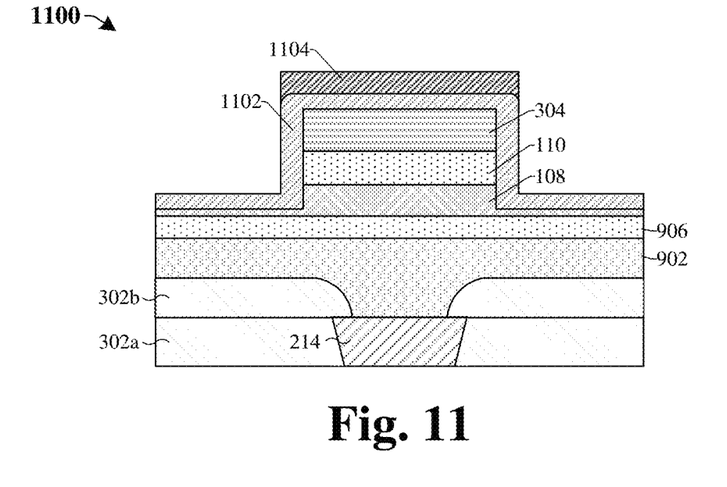

As shown in cross-sectional view 1100 of FIG. 11, the memory cell layer stack (904 of FIG. 10) is patterned according to the first masking layer (1002 of FIG. 10), thereby defining a data storage structure 108, a top electrode 110, and a capping layer 304. In some embodiments, the patterning process may include: exposing unmasked regions of layers underlying the first masking layer (1002 of FIG. 10) to one or more etchants; and performing a removal process (not shown) to remove the first masking layer (1002 of FIG. 10) In some embodiments, the patterning process may etch through a portion of the data storage structure 108, such that the data storage structure 108 continuously extends along an upper surface of the bottom electrode layer 906 after performing the patterning process.

Also illustrated in FIG. 11, a passivation layer 1102 is formed over the capping layer 304 and the data storage structure 108. In some embodiments, the passivation layer 1102 may, for example, be or comprise silicon carbide, silicon nitride, silicon oxynitride, or the like. In further embodiments, the passivation layer 1102 may be deposited by, for example, CVD, PVD, ALD, or another suitable deposition process. In addition, after forming the passivation layer 1102 a second masking layer 1104 is formed over the passivation layer 1102, in which the second masking layer 1104 overlies the capping layer 304.

Figure 12:
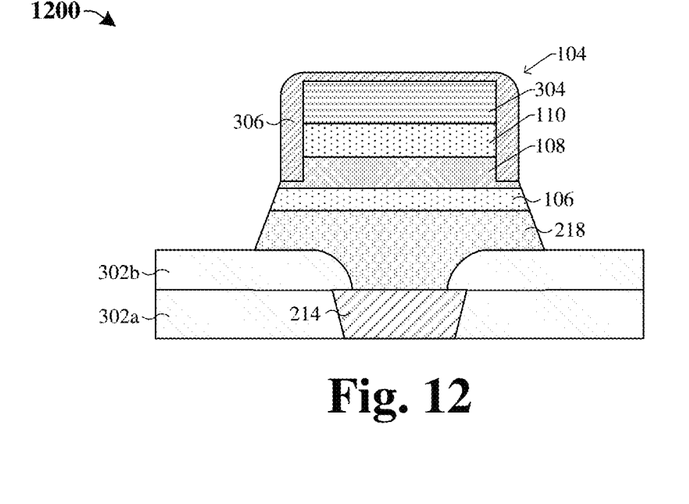

As shown in cross-sectional view 1200 of FIG. 12, a patterning process is performed on the structure of FIG. 11 according to the second masking layer (1104 of FIG. 11), thereby defining a bottom electrode 106, a bottom electrode via 218, a sidewall spacer structure 306, and a memory cell 104. In some embodiments, the patterning process etches completely through the data storage structure 108. In further embodiments, after the patterning process, the data storage structure 108, the bottom electrode 106, and the bottom electrode via 218 each have slanted opposing outer sidewalls. In some embodiments, the memory cell 104 includes the capping layer 304, the top electrode 110, the bottom electrode 106, and the data storage structure 108 disposed between the bottom and top electrodes 106, 110.

Figure 13:
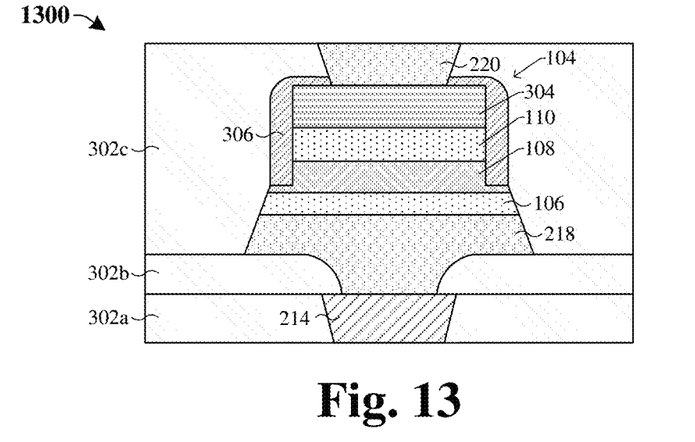

As shown in cross-sectional view 1300 of FIG. 13, a first upper ILD layer 302c is formed over and around the memory cell 104. In some embodiments, the first upper ILD layer 302c may, for example, be deposited by PVD, CVD, ALD, or another suitable deposition process. Further, a top electrode via 220 is formed over the memory cell 104, in which the top electrode via 220 extends through the first upper ILD layer 302c and the sidewall spacer structure 306 to contact the capping layer 304. In some embodiments, the top electrode via 220 may be formed by, for example, CVD, PVD, electroless plating, electroplating, or another suitable growth or deposition process.

Figure 14:
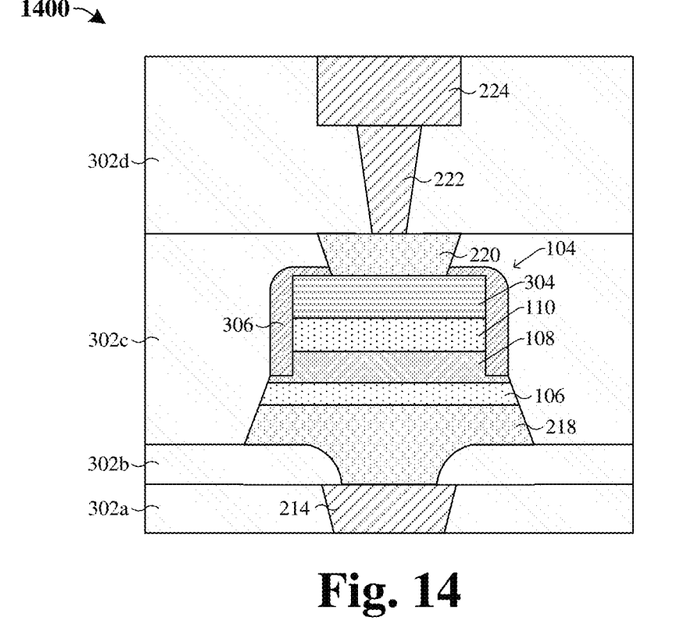

As shown in cross-sectional view 1400 of FIG. 14, a second upper ILD layer 302d is formed over the first upper ILD layer 302c. In some embodiments, the second upper ILD layer 302d may be deposited by, for example, CVD, PVD, ALD, or another suitable deposition process. Further, an upper interconnect via 222 and an upper interconnect wire 224 are formed over the top electrode via 220. In some embodiments, the upper interconnect via 222 and/or the upper interconnect wire 224 may be formed by a single damascene process or may be formed by a dual damascene process.

Figure 15:
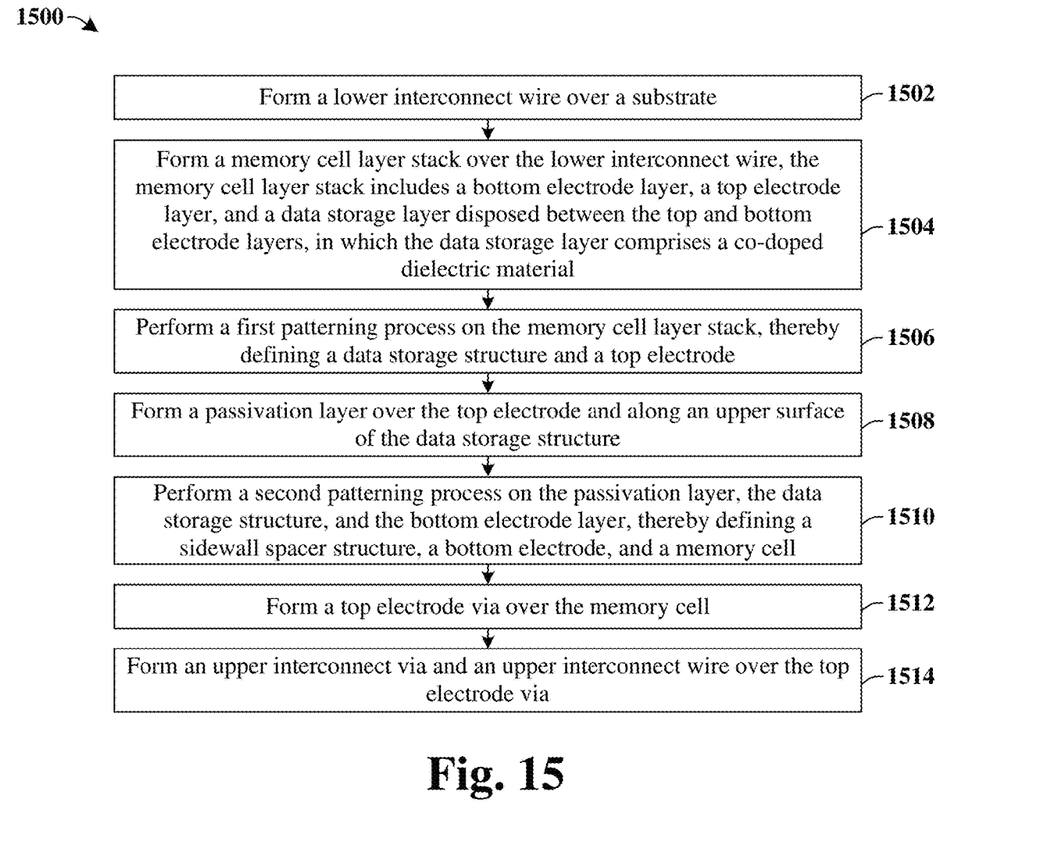
FIG. 15 illustrates a flowchart according to some embodiments of a method for forming a memory cell with a low forming voltage.

FIG. 15 illustrates a method 1500 for forming a memory device including a memory cell having a data storage structure that comprises a first dopant and a second dopant according to the present disclosure. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1502, a lower interconnect wire is formed over a substrate. FIG. 9 illustrates a cross-sectional view 900 corresponding to some embodiments of act 1502.

At act 1504, a memory cell layer stack is formed over the lower interconnect wire. The memory cell layer stack includes a bottom electrode layer, a top electrode layer, and a data storage layer disposed between the top and bottom electrode layers. The data storage layer comprises a co-doped dielectric material. FIG. 9 illustrates a cross-sectional view 900 corresponding to some embodiments of act 1504.

At act 1506, a first patterning process is performed on the memory cell layer stack, thereby defining a data storage structure and a top electrode. FIGS. 10 and 11 illustrate cross-sectional views 1000 and 1100 corresponding to some embodiments of act 1506.

At act 1508, a passivation layer is formed over the top electrode and along an upper surface of the data storage structure. FIG. 11 illustrates a cross-sectional view 1100 corresponding to some embodiments of act 1508.

At act 1510, a second patterning process is performed on the passivation layer, the data storage structure, and the bottom electrode layer, thereby defining a sidewall spacer structure, a bottom electrode, and a memory cell. FIG. 12 illustrates a cross-sectional view 1200 corresponding to some embodiments of act 1510.

At act 1512, a top electrode via is formed over the memory cell. FIG. 13 illustrates a cross-sectional view 1300 corresponding to some embodiments of act 1512.

At act 1514, an upper interconnect via and an upper interconnect wire are formed over the top electrode via. FIG. 14 illustrates a cross-sectional view 1400 corresponding to some embodiments of act 1514.

Accordingly, in some embodiments, the present disclosure relates to a memory cell comprising a top electrode, a bottom electrode, and a data storage structure disposed between the top and bottom electrodes, where the data storage structure comprises a co-doped dielectric material.

In some embodiments, the present application provides a memory device including a substrate; a bottom electrode overlying the substrate; a top electrode overlying the bottom electrode; and a data storage structure disposed between the top and bottom electrodes, wherein the data storage structure comprises a dielectric material doped with a first dopant and a second dopant.

In some embodiments, the present application provides an integrated chip including a substrate; a bottom electrode via overlying the substrate; a top electrode via overlying the bottom electrode via; and a resistive random access memory (RRAM) cell disposed between the bottom electrode via and the top electrode via, wherein the RRAM cell includes a top electrode, a bottom electrode, and a data storage structure disposed between the top and bottom electrodes, wherein the data storage structure comprises a co-doped high κ dielectric material.

In some embodiments, the present application provides a method for forming a memory device, the method includes forming a lower conductive wire over a substrate; depositing a bottom electrode layer over the lower conductive wire; forming a data storage structure over the bottom electrode layer such that the data storage structure comprises a dielectric material, a first dopant, and a second dopant; forming a top electrode over the data storage structure; and patterning the bottom electrode layer, the data storage structure, and the top electrode, thereby defining a memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, comprising:
    forming a bottom electrode over a substrate;
    forming a data storage structure on the bottom electrode, wherein the data storage structure is co-doped with a first dopant and a second dopant, wherein a first atomic percentage of the first dopant in the data storage structure is different from a second atomic percentage of the second dopant in the data storage structure, wherein the data storage structure is co-doped with the first and second dopants by a single deposition process; and
    forming a top electrode on the data storage structure.

2. The method of claim 1, wherein the first atomic percentage is within a range of about 1 to 15 percent and the second atomic percentage is within a range of about 2 to 20 percent.

3. The method of claim 1, wherein the first dopant comprises nitrogen, carbon, or fluorine, wherein the second dopant comprises tantalum, cerium, hafnium, or zirconium.

4. The method of claim 1, wherein a thickness of the data storage structure is within a range of about 20 to 80 angstroms.

5. The method of claim 1, further comprising performing an annealing process on the data storage structure.

6. The method of claim 1, wherein forming the data storage structure comprises:
    performing a first patterning process on the data storage structure, wherein the first patterning process defines upper opposing sidewalls of the data storage structure;
    forming a passivation layer over the data storage structure and along the upper opposing sidewalls; and
    performing a second patterning process on the data storage structure, wherein the second patterning process defines lower opposing sidewalls of the data storage structure, wherein the upper opposing sidewalls are spaced between the lower opposing sidewalls.

7. The method of claim 6, wherein the second patterning process is performed while the passivation layer is disposed on the data storage structure.

8. A method for forming a memory device, comprising:
    forming a bottom electrode via over a substrate;
    forming a bottom electrode on the bottom electrode via;
    forming a data storage structure on the bottom electrode, wherein the data storage structure comprises a co-doped dielectric material;
    forming a top electrode on the data storage structure;
    forming a capping layer on the top electrode;
    performing a first etch process on the capping layer, the top electrode, and the data storage structure, wherein first opposing sidewalls of the data storage structure, sidewalls of the top electrode, and sidewalls of the capping layer are aligned; and
    forming a sidewall spacer structure over the data storage structure, wherein the sidewall spacer structure extends from a top surface of the capping layer to the first opposing sidewalls of the data storage structure.

9. The method of claim 8, wherein a width of the data storage structure discretely increases from a top surface of the data storage structure in a direction towards the bottom electrode via.

10. The method of claim 8, wherein the data storage structure is deposited by chemical vapor deposition, physical vapor deposition, sputtering, or co-sputtering.

11. The method of claim 8, further comprising:
    performing a second etch process on the data storage structure and the bottom electrode, wherein second opposing sidewalls of the data storage structure and sidewalls of the bottom electrode are aligned, wherein a width of the bottom electrode is greater than a width of the top electrode.

12. The method of claim 11, wherein the sidewall spacer structure is formed before performing the second etch process.

13. The method of claim 8, wherein a thickness of the data storage structure increases from an outer sidewall of the data storage structure in a direction towards a center of the data storage structure.

14. A method for forming a memory device, the method comprising:
    forming a lower conductive wire over a substrate;
    depositing a bottom electrode layer over the lower conductive wire;
    forming a data storage structure over the bottom electrode layer such that the data storage structure comprises a dielectric material co-doped with a first dopant and a second dopant with different atomic percentages, wherein forming the data storage structure comprises depositing a compound of the dielectric material and the second dopant while concurrently exposing the compound to a first gas that comprises the first dopant;
    forming a top electrode over the data storage structure; and
    patterning the bottom electrode layer, the data storage structure, and the top electrode, thereby defining a resistive random access memory (RRAM) cell.

15. The method of claim 14, wherein the data storage structure comprises a first atomic percentage of the first dopant and a second atomic percentage of the second dopant, wherein the second atomic percentage is greater than the first atomic percentage.

16. The method of claim 14,
    wherein depositing the compound includes performing a physical vapor deposition process (PVD).

17. The method of claim 14, wherein the dielectric material is aluminum oxide, the first dopant is nitrogen, and the second dopant is tantalum.

18. The method of claim 14, wherein the co-doped dielectric material continuously vertically extends from a top surface of the bottom electrode layer to a bottom surface of the top electrode.

19. The method of claim 14, wherein a width of the data storage structure is greater than a width of the top electrode.

20. The method of claim 14, wherein patterning the bottom electrode layer, the data storage structure, and the top electrode comprises:
    performing a first etch on the top electrode and the data storage structure; and
    performing a second etch on the data storage structure and the bottom electrode layer after the first etch.

* * * * *